(12) United States Patent
Huang et al.

(10) Patent No.: US 9,418,886 B1
(45) Date of Patent: Aug. 16, 2016

(54) METHOD OF FORMING CONDUCTIVE FEATURES

(71) Applicant: Taiwan Semiconductor Manufacturing Company, Ltd., Hsin-Chu (TW)

(72) Inventors: Chien-Hua Huang, Miaoli County (TW); Chieh-Han Wu, Kaohsiung (TW); Chung-Ju Lee, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/808,574

(22) Filed: Jul. 24, 2015

(51) Int. Cl.
  *H01L 21/76* (2006.01)
  *H01L 21/768* (2006.01)
  *H01L 21/321* (2006.01)
  *H01L 21/00* (2006.01)

(52) U.S. Cl.
  CPC ...... *H01L 21/76804* (2013.01); *H01L 21/3212* (2013.01); *H01L 21/76805* (2013.01); *H01L 21/76832* (2013.01)

(58) Field of Classification Search
  None
  See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2001/0046780 A1 * | 11/2001 | Nakagawa | H01L 21/7681 438/712 |
| 2004/0161923 A1 * | 8/2004 | Bae | H01L 21/76804 438/633 |
| 2007/0087486 A1 * | 4/2007 | Tanaka | H01L 21/76804 438/149 |
| 2009/0101943 A1 * | 4/2009 | Miyashita | H01L 21/76804 257/288 |
| 2012/0132970 A1 * | 5/2012 | Park | H01L 21/76804 257/296 |
| 2014/0001574 A1 | 1/2014 | Chen et al. | |
| 2014/0110755 A1 | 4/2014 | Colinge | |
| 2014/0151812 A1 | 6/2014 | Liaw | |

* cited by examiner

*Primary Examiner* — Evren Seven
(74) *Attorney, Agent, or Firm* — Haynes and Boone, LLP

(57) ABSTRACT

A method includes forming a patterned mask layer over a conductive layer; forming a first dielectric layer over the patterned mask layer and the conductive layer; selectively etching the first dielectric layer, thereby exposing an upper surface of the patterned mask layer, wherein the upper surface of the first dielectric layer is lower than a top surface of the patterned mask layer; removing the patterned mask layer; and selectively etching the conductive layer to form a conductive feature having a tapered profile.

20 Claims, 13 Drawing Sheets

METHOD OF FORMING CONDUCTIVE FEATURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has increased the complexity of IC processing and manufacturing and, for these advancements to be realized, similar developments in IC processing and manufacturing are needed. However, needs still exist in forming conductive features to connect features in IC devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
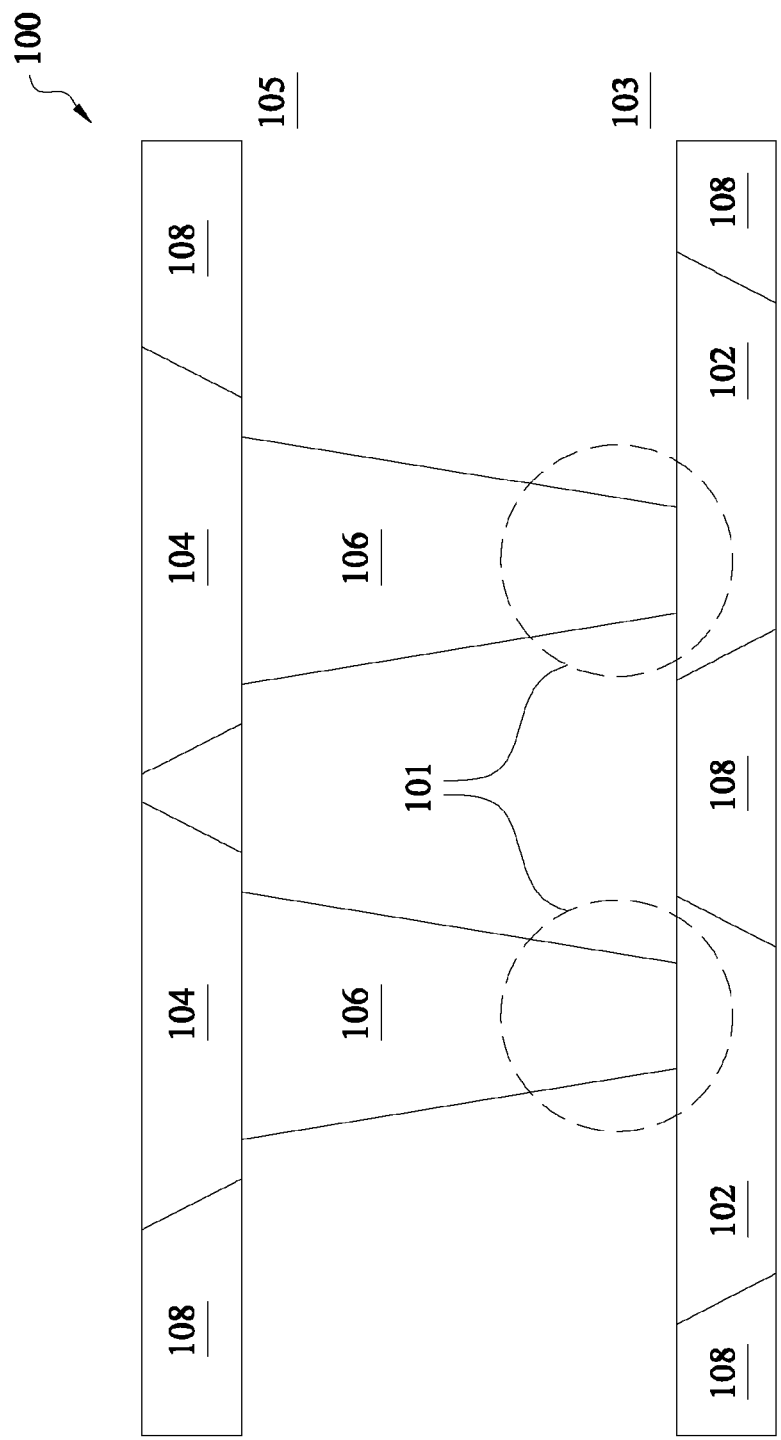
FIG. 1 illustrates an example of a misaligned via of a semiconductor device in accordance with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multilayer interconnects are used to connect various devices (transistors, resistors, capacitors, etc.) to form an IC. FIG. 1 shows an exemplary multilayer interconnect structure 100. In a typical multilayer interconnect structure, such as the one shown in FIG. 1, conductive lines 102 and 104 (e.g., copper wires) are laid in stacked dielectric layers 108 and are connected through vias 106 from one layer (e.g., 103) to another layer (e.g., 105). Copper wires and vias are typically fabricated using single or dual damascene processes. In such processes, an underlying dielectric layer is patterned to form trenches, then the trenches are overfilled with copper, and chemical-mechanical planarization (CMP) is used to remove excessive copper, thereby forming copper wires in the trenches. Subsequently, another dielectric layer is formed over the underlying dielectric layer and the above process is repeated to form vias and upper level copper wires. The multiple dielectric layers are patterned with lithography (or photolithography) processes. Sometimes, overlay errors between lithography processes may result in via misalignment (e.g., 101) with respect to the target copper wire. A misaligned via, such as via 106, may cause an accidental bridge (shorting) with a nearby copper wire, creating IC defects; or cause excessive etching of the underlying dielectric layer, creating IC reliability issues. Such via-wire misalignment issues become more problematic as the IC miniaturization continues.

Figure 2:
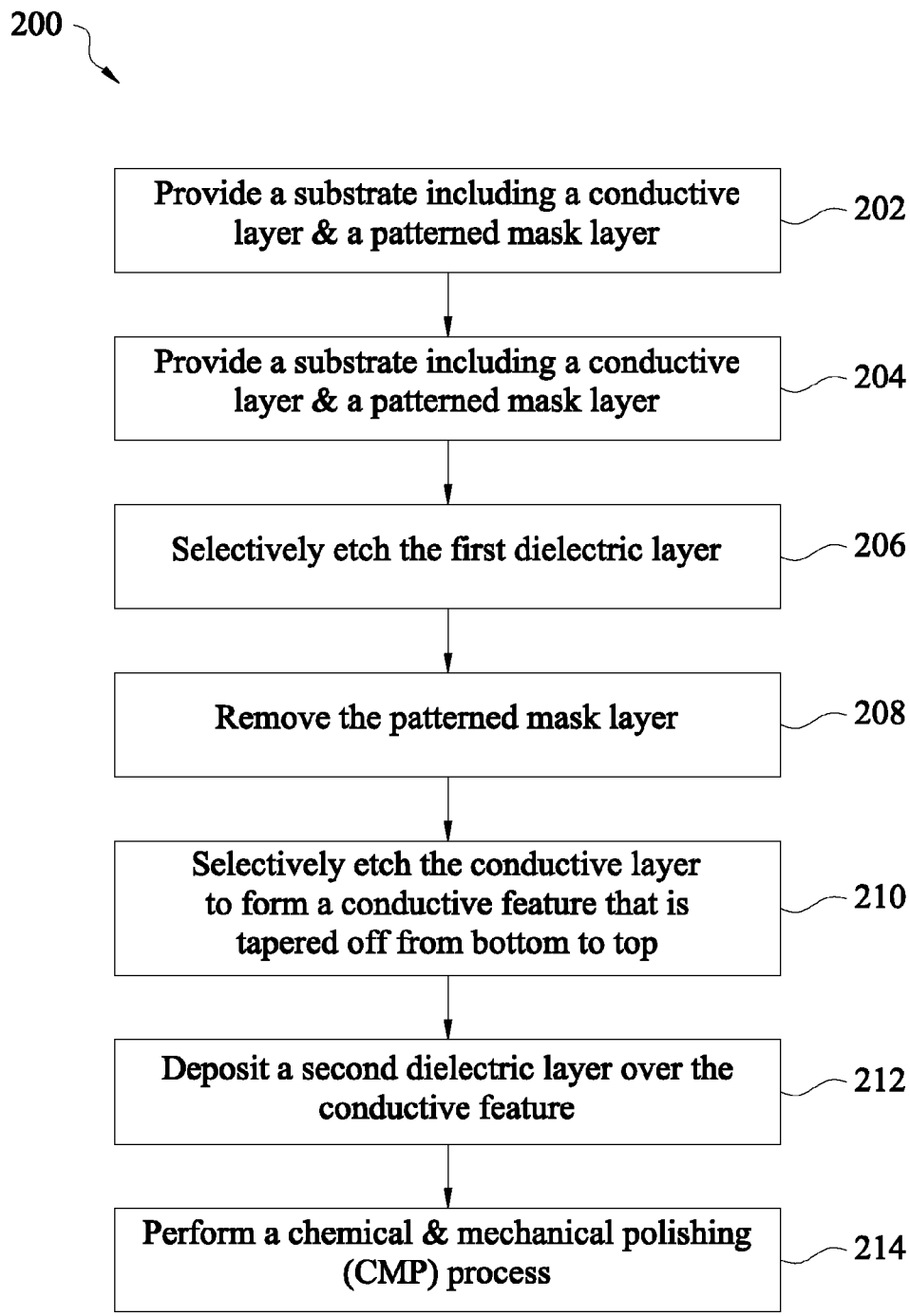
FIG. 2 illustrates a flow chart to form a conductive feature of a semiconductor device in accordance with embodiments of the present disclosure.

The present disclosure offers a novel way of providing a conductive feature that prevents misalignment of vias. For example, FIG. 2 illustrates a method 200 for fabricating such a conductive feature on a semiconductor substrate that helps prevent misalignment of vias. FIGS. 3A, 3B, 3C, 3D, 3E, 3F, and 3G are cross-sectional views of an embodiment of a device 300 fabricated according to the method 200 of FIG. 2. It should be understood that FIGS. 3A-3G and the device 300 are representative and exemplary only. In an embodiment, the semiconductor device 300 is an interconnection portion (e.g., conductive lines) of a complementary metal-oxide-semiconductor (CMOS) device.

Further, it is understood that the method 200 includes steps having features of a complementary metal-oxide-semiconductor (CMOS) technology process flow and thus, are only described briefly herein. Additional steps may be performed before, after, and/or during the method 200. It is also understood that parts of a semiconductor device 300, illustrated in FIGS. 3A-3G, may be fabricated by complementary metal-oxide-semiconductor (CMOS) technology process flow, and thus some processes are only briefly described herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. The semiconductor device 300 includes a plurality of semiconductor devices (e.g., transistors), which may be interconnected.

For example, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and/or combinations thereof.

The method 200 starts at block 202 with providing a substrate 301 that includes a conductive layer 304 and a patterned mask layer 310. In the illustrated embodiment of FIG. 3A, the patterned mask layer 310 may include a plurality of pattern features that are positioned above the conductive layer 304. In some specific embodiments, the substrate 301 may further include an etch stop (ETS) layer 302 that is positioned below the conductive layer and/or an anti-reflective coating (ARC) layer 306 that is positioned between the patterned mask layer 310 and the conductive layer 304.

More specifically, in accordance with various embodiments, the conductive layer 304 may be made of any suitable metal materials such as for example, copper (Cu), aluminum (Al), tungsten (W), and/or cobalt (Co). The etch stop layer 302 includes a dielectric material that has a higher density than the materials in the conductive layer 304. For example, the etch stop layer 302 may include a material selected from the group consisting of SiCN, SiCO, $SiO_2$, SiN, and/or AlON while other suitable materials for the etch stop layer 302 may be used and still fall within the scope of the present disclosure. The pattern features of the patterned mask layer 310 may include photoresist material, or simply resist material. The anti-reflective coating layer 306 may be formed of a material selected from the group consisting of silicon oxides, silicon nitrides and/or silicon oxy-nitrides.

Figure 3A:
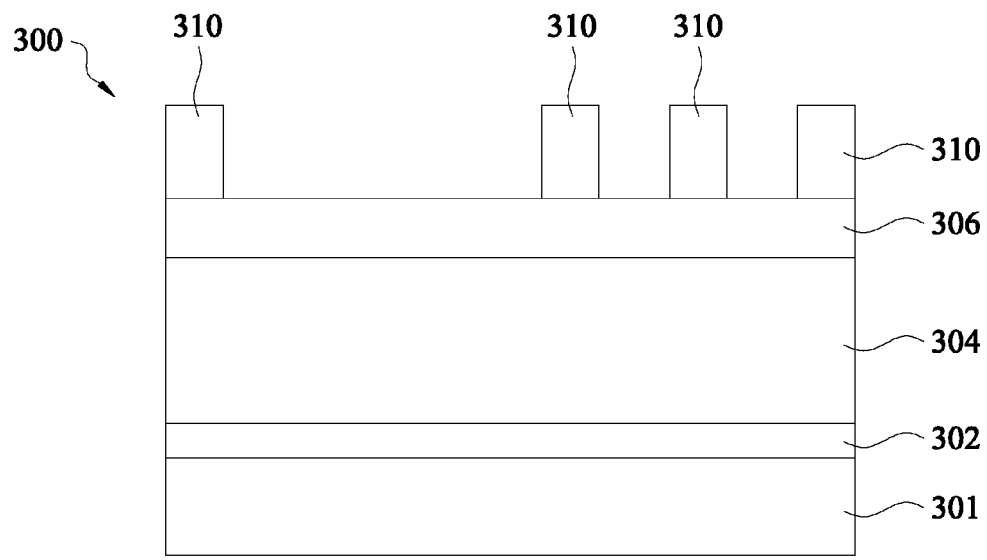
FIGS. 3A, 3B, 3C, 3D, 3E, 3F, and 3G illustrate cross-sectional views of the formed conductive feature at various fabrication stages in accordance with the method of FIG. 2.
Figure 3B:
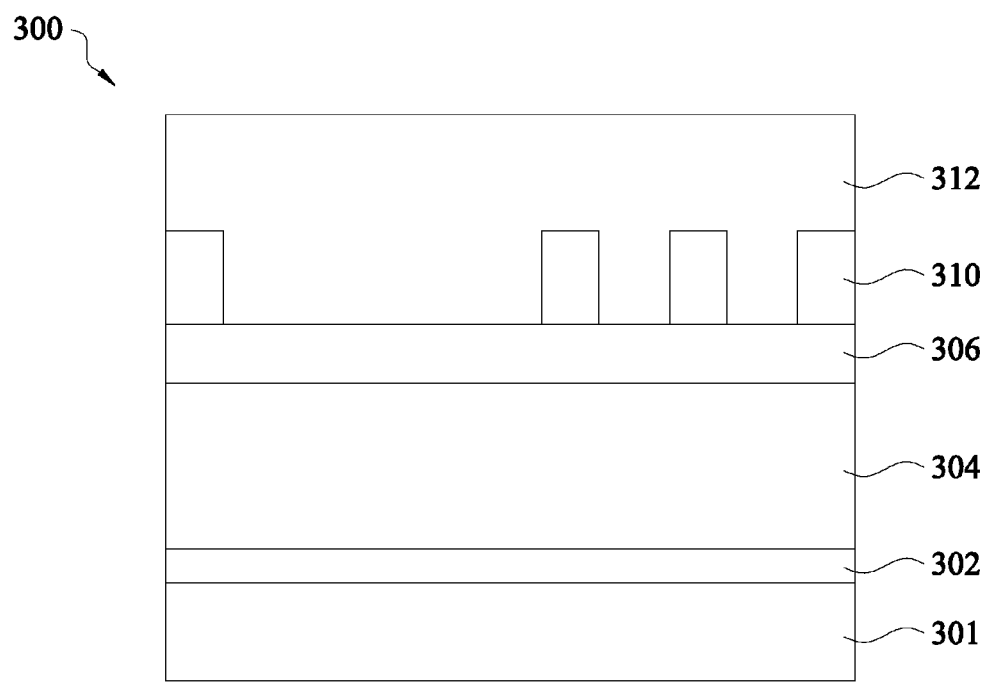
Figure 3C:
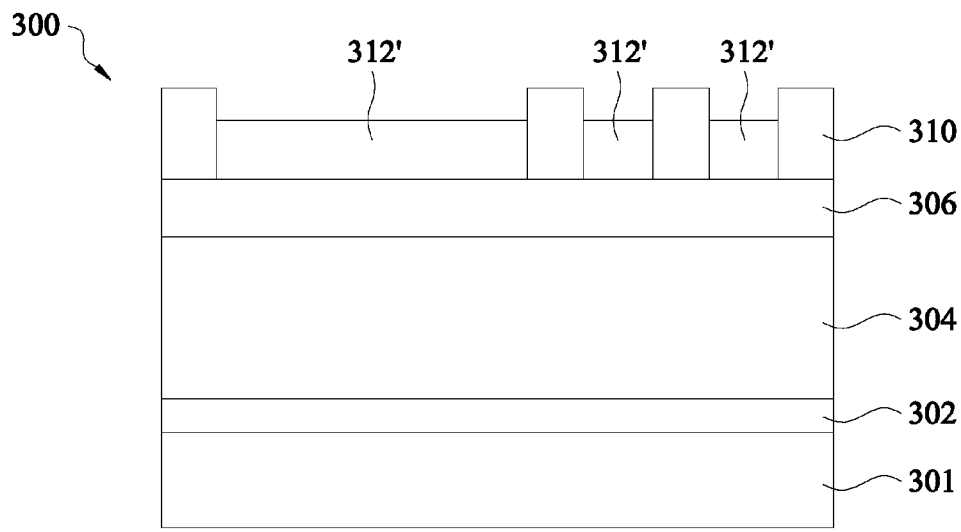

Referring to FIG. 2 and FIG. 3B, the method 200 continues to block 204 with depositing a first dielectric layer 312 over the patterned mask layer 310 and the anti-reflective layer 306. In an embodiment, the first dielectric layer 312 may be formed of spin-on glass (SOG) materials, spin-on dielectric (SOD) materials, resin materials, organometallic polymer materials, silicon nitride (SiN), silicon dioxide ($SiO_2$), amorphous silicon, carbon-based materials, titanium nitride (TiN), titanium oxide (TiO), and/or tantalum nitride (TaN). Further, the depositing the first dielectric layer 312 may include a spin-on coating approach, a chemical vapor deposition (CVD) approach, and/or an atomic layer deposition (ALD) approach.

The method 200 then continues to block 206 with selectively etching the first dielectric layer 312 to form recessed first dielectric layer 312'. As a result, an upper surface of the patterned mask layer 310 is exposed. As shown in the illustrated embodiment of FIG. 3C, the upper surface of the patterned mask layer 310 is opposite a bottom surface of patterned mask layer 310 facing conductive layer 304. In some specific embodiments, the selective etching of the first dielectric layer 312 may be implemented using a reactive ion etching (RIE) process tuned for recessing the first dielectric layer 312 while the patterned mask layer 310 remains substantially unchanged/intact in such an RIE process.

Figure 3D:
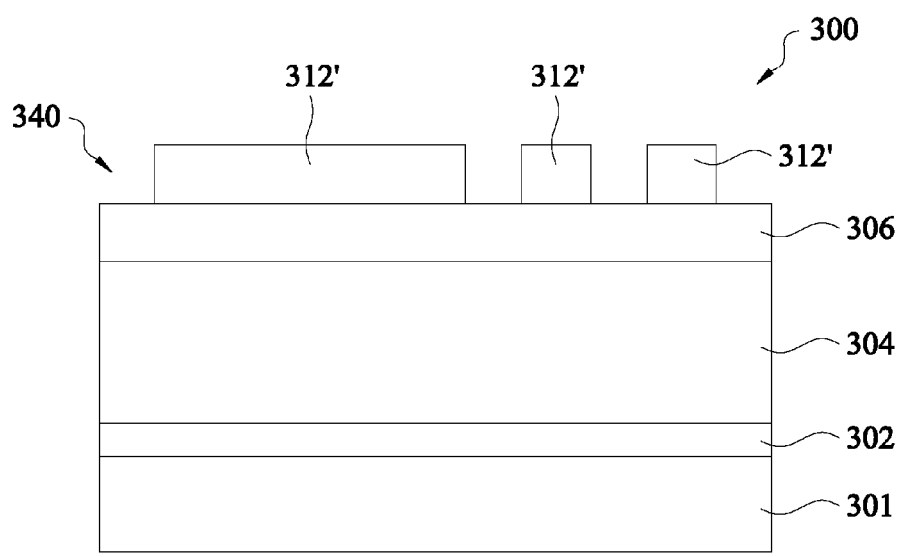

The method 200 continues to block 208 with removing the patterned mask layer 310. As shown in FIG. 3D, after the removal of the patterned mask layer 310, a top surface (e.g., 340) of the anti-reflective layer 306 is exposed. This exposed surface 340 of the anti-reflective layer 306 includes a reciprocal pattern feature to the pattern feature provided by the patterned mask layer 310. That is, the portion of the top surface of the anti-reflective layer 306 that is covered by the patterned feature is now exposed. Thus, in an embodiment, the first dielectric material 312/312' may be referred to as "reverse-tone patterning" material. In some specific embodiments, the removing the patterned mask layer 310 may include dry etching, wet etching, and a variety of suitable etching process known in the art.

Figure 3E:
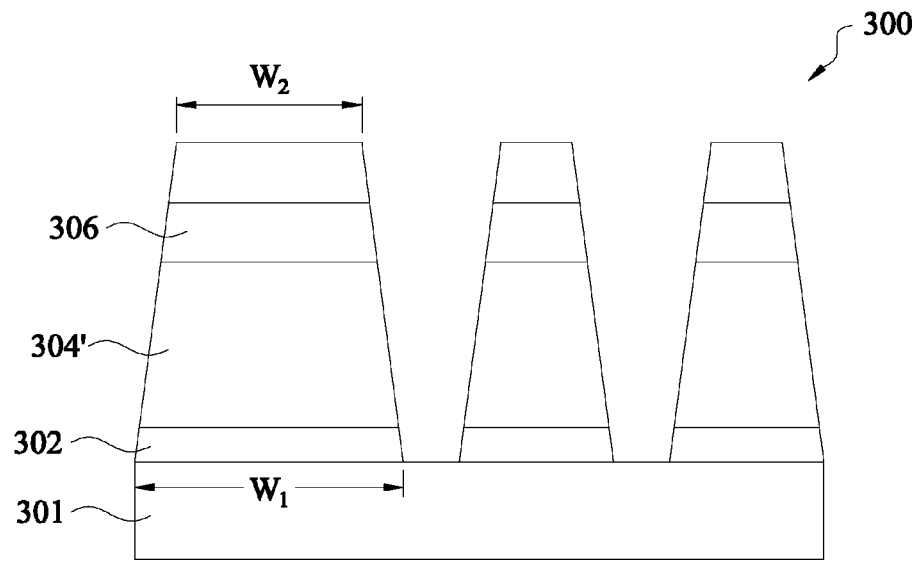

The method 200 continues to block 210 with selectively etching the anti-reflective layer 306, the conductive layer 304, and/or the etch stop layer 302 through the exposed surface 340 as shown in FIG. 3E. In the illustrated embodiment of FIG. 3E, the etched conductive layer forms a conductive feature 204' that includes a tapered profile. In an example, a tapered profile may be implemented as the conductive feature 304' is tapered off from bottom (from the etch stop layer 302) to top (to the anti-reflective layer 306). More specifically, as illustrated in the embodiment of FIG. 3E, the conductive feature 304' includes a lower portion with a width "$W_1$" and an upper portion with a width "$W_2$" and $W_1$ is greater than $W_2$. The etching the conductive layer 304 may include dry etching, plasma-based dry etching, and/or other etching processes. In an example, etching the conductive layer 304 may be implemented in a plasma etching chamber with flow of chemicals such as fluoride-based gaseous materials, chloride-based gaseous materials, and/or methane-based gaseous materials.

Figure 3F:
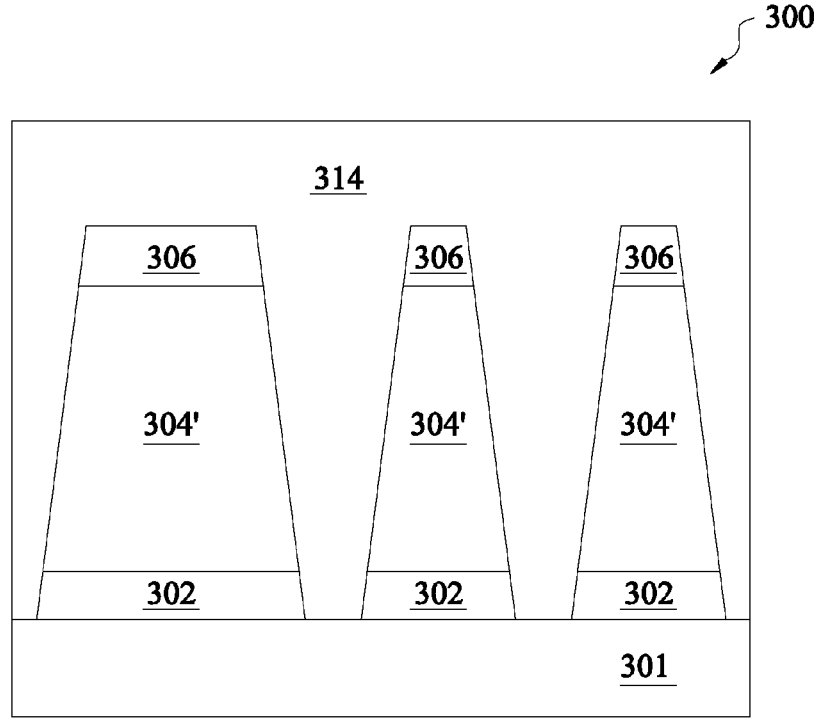
Figure 3G:
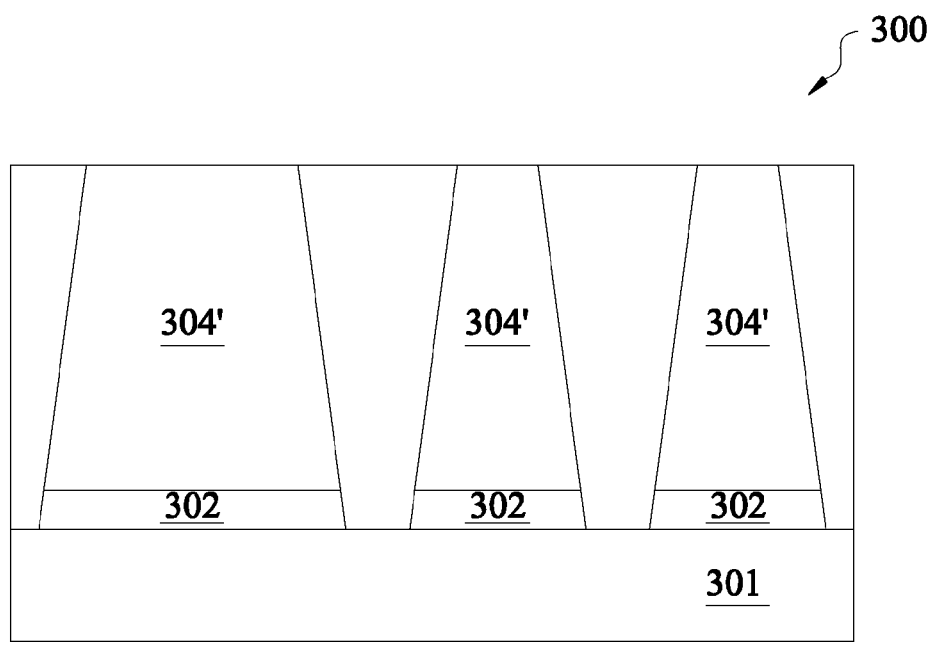

Referring still to FIG. 2 in conjunction with FIG. 3F, the method 200 continues to block 212 with depositing a second dielectric layer 314 over the formed conductive feature 304'. In some specific embodiments, the second dielectric layer 314 may be a low-k (e.g., k<3.0) dielectric material and such low-k dielectric materials may be deposited by using a spin-on coating and/or a CVD process. The second dielectric layer 314 may be configured to isolate/insulate each formed conductive feature. The method 200 then proceeds to block 214 with performing a chemical mechanical polishing (CMP) process. The CMP process planarizes a top surface of the device 300 through removing excessive materials (e.g., 314) and conductive materials (e.g., 304/304') such that a polished surface of the conductive feature 304' and a polished surface of the second dielectric layer 314 are coplanar as shown in FIG. 3G.

Figure 4:
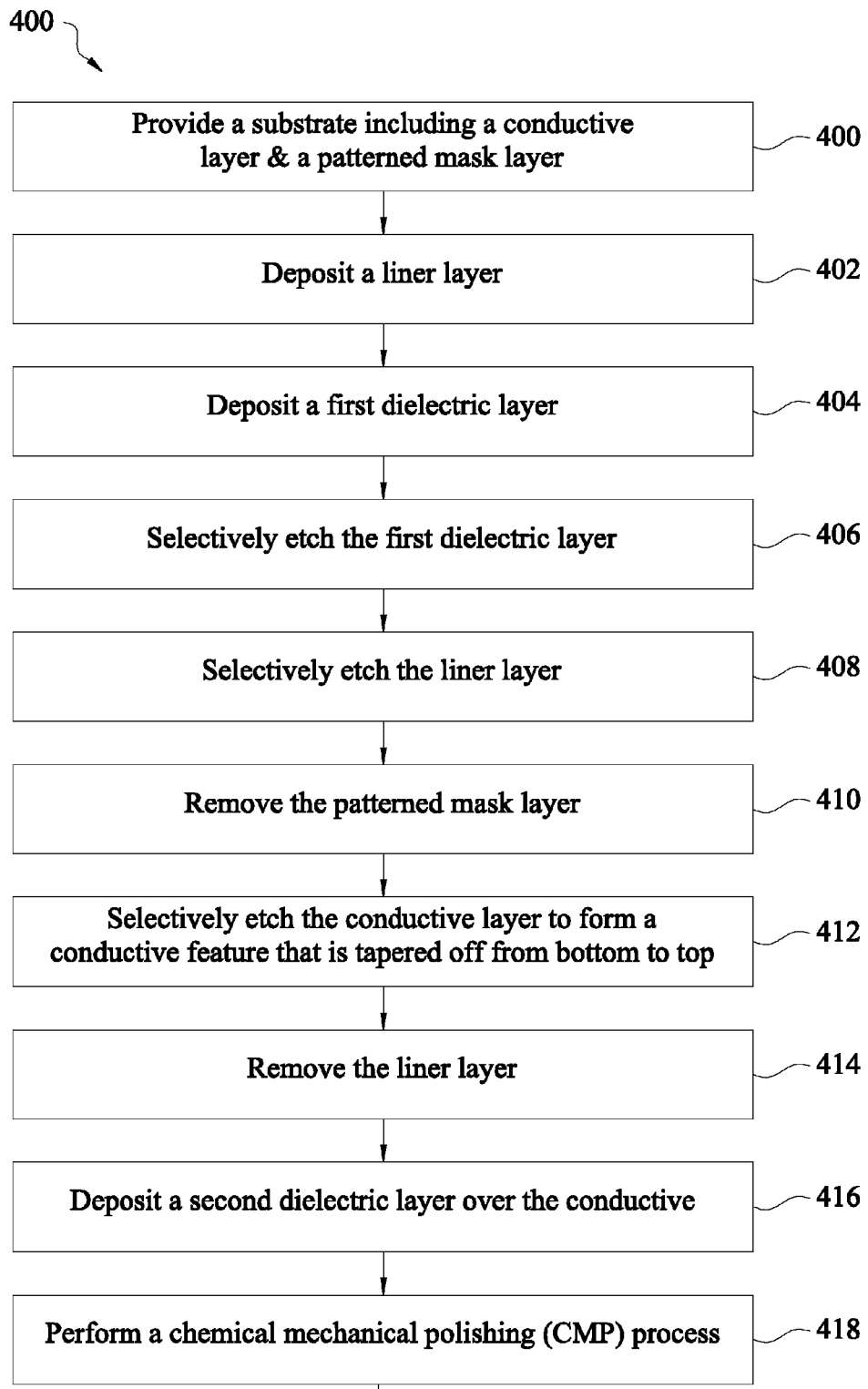
FIG. 4 illustrates a flow chart to form a conductive feature of a semiconductor device in accordance with embodiments of the present disclosure.

FIG. 4 illustrates a method 400 for fabricating a conductive feature on a semiconductor substrate that helps prevent misalignment of vias. FIGS. 5A, 5B, 5C, 5D, 5E, 5F, 5G, 5H, and 5I are cross-sectional views of an embodiment of a device 400 fabricated according to the method 400 of FIG. 4. It should be understood that FIGS. 5A-5I and the device 500 are representative and exemplary only. In an embodiment, the semiconductor device 500 is an interconnection portion (e.g., conductive lines) of a complementary metal-oxide-semiconductor (CMOS) device.

Further, it is understood that the method 400 includes steps having features of a complementary metal-oxide-semiconductor (CMOS) technology process flow and thus, are only described briefly herein. Additional steps may be performed before, after, and/or during the method 400. It is also understood that parts of a semiconductor device 500, illustrated in FIGS. 5A-5I, may be fabricated by complementary metal-oxide-semiconductor (CMOS) technology process flow, and thus some processes are only briefly described herein. Further, the semiconductor device 500 may include various other devices and features, such as additional transistors, bipolar junction transistors, resistors, capacitors, diodes, fuses, etc., but is simplified for a better understanding of the inventive concepts of the present disclosure. The semiconductor device 500 includes a plurality of semiconductor devices (e.g., transistors), which may be interconnected.

For example, the device 500 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 400 starts at block 402 with providing a substrate 501 that includes a conductive layer 504 and a patterned mask layer 508. In the illustrated embodiment of FIG. 5A, the patterned mask layer 508 may include a plurality of pattern features that are positioned above the conductive layer 504. In some specific embodiments, the substrate 501 may further include an etch stop layer (ESL) 502 that is positioned below the conductive layer 504 and/or an anti-reflective coating (ARC) layer 506 that is positioned between the patterned mask layer 508 and the conductive layer 504. The conductive layer 504 may be made of any suitable metal materials such as for example, copper (Cu), aluminum (Al), tungsten (W), and/or cobalt (Co). The etch stop layer 502 includes a dielectric material that has a higher density than the materials in the conductive layer 504. For example, the etch stop layer 502 may include a material selected from the group consisting of SiCN, SiCO, $SiO_2$, SiN, and AlON while other suitable materials for the etch stop layer 502 may be used and still fall within the scope of the present disclosure. The pattern features of the patterned mask layer 508 may include photoresist material, or simply resist material. The anti-reflective coating layer 506 may be formed of a material selected from the group consisting of silicon oxides, silicon nitrides and silicon oxynitrides.

The method 400 proceeds to block 402 with depositing a liner layer 510 over the patterned mask layer 508 and the anti-reflective coating layer 506. In accordance with various illustrative embodiments, the depositing the liner layer 510 includes using a variety of suitable deposition methods such as for example, a CVD method, an ALD method, and/or a spin-on coating method. More specifically, the liner layer 510 is made of a material selected from the group consisting of directed self-assembly material, titanium nitride (TiN), titanium oxide (TiO), tantalum nitride (TaN), silicon nitride (SiN), silicon dioxide ($SiO_2$), and organometallic polymer material. In a specific embodiment, the thickness of the liner layer may range between about ¼ pitch to about 1 pitch. Generally, a pitch may be a distance that is defined as a center-to-center distance between two features (e.g., interconnect lines) of an integrated circuit.

The method 400 continues to block 404 with depositing a first dielectric layer 512 over the liner layer 510. In an embodiment, the first dielectric layer 512 may be formed of spin-on glass (SOG) materials, spin-on dielectric (SOD) materials, resin materials, organometallic polymer materials, silicon nitride (SiN), silicon dioxide ($SiO_2$), amorphous silicon, carbon-based materials, titanium nitride (TiN), titanium oxide (TiO), and/or tantalum nitride (TaN). Further, the depositing the first dielectric layer 512 may include a spin-on coating method, a CVD method, and/or an ALD method.

The method 400 then continues to block 406 with selectively etching the first dielectric layer 512 to form recessed first dielectric layer 512'. As a result, an upper surface of the liner layer 510 is exposed. As shown in the illustrated embodiment of FIG. 5D, an upper surface of the recessed first dielectric layer 512' is lower than the upper surface of the intact liner layer 510. In some specific embodiments, the selective etching of the first dielectric layer 512 may be implemented using a reactive ion etching (RIE) process and/or a plasma etching process tuned for recessing the first dielectric layer 512 while the liner layer 510 remains substantially unchanged/intact in such an RIE process.

Figure 5A:
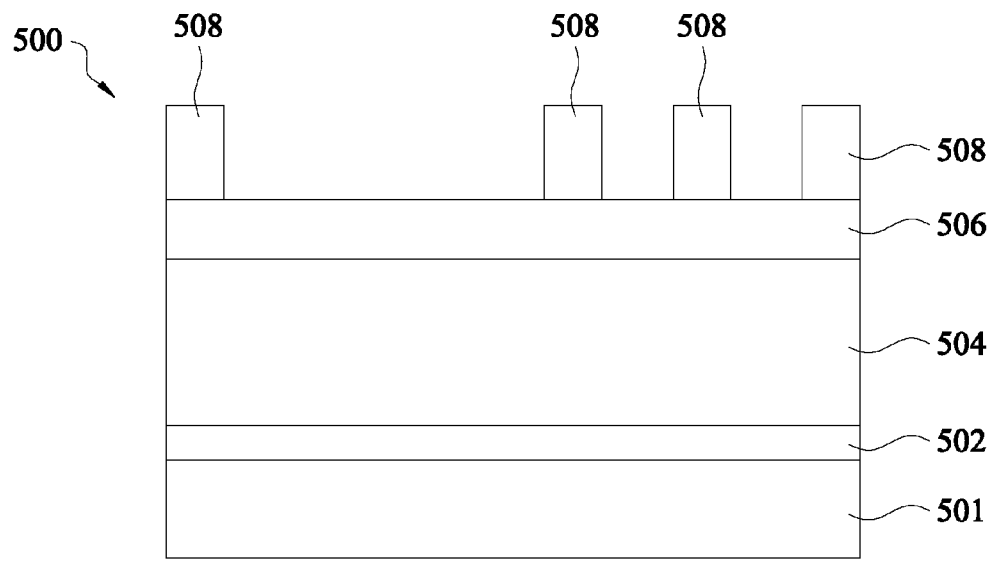
FIGS. 5A, 5B, 5C, 5D, 5E, 5F, 5G, 5H, and 5I illustrate cross-sectional views of the formed conductive feature at various fabrication stages in accordance with the method of FIG. 4.
Figure 5B:
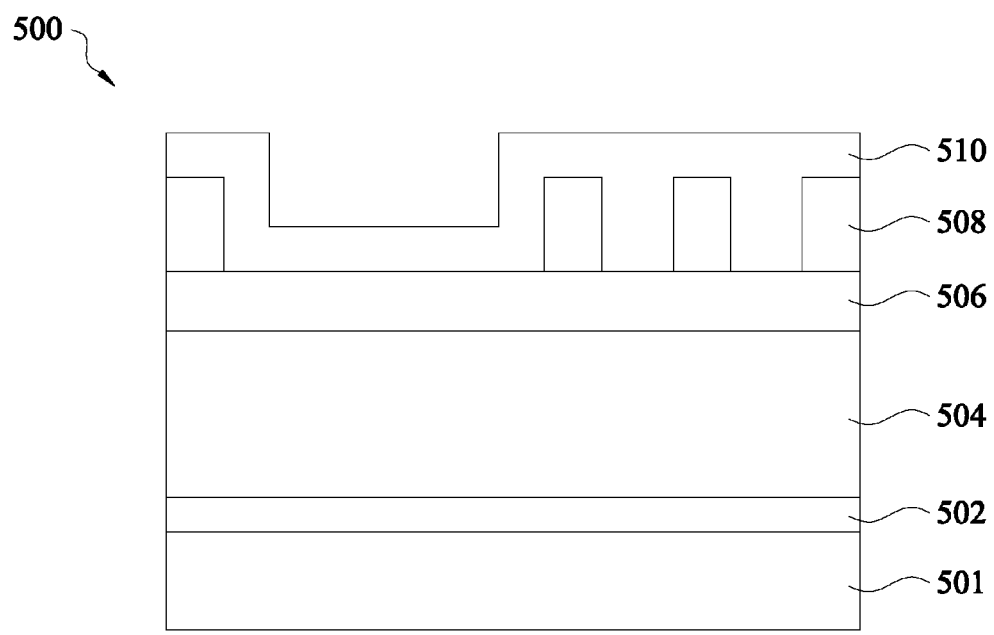
Figure 5C:
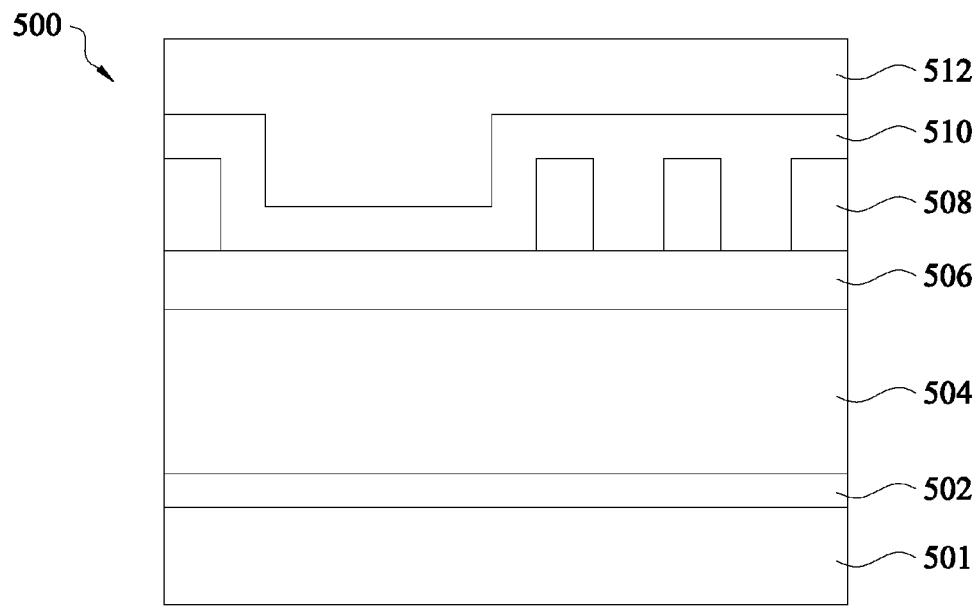
Figure 5D:
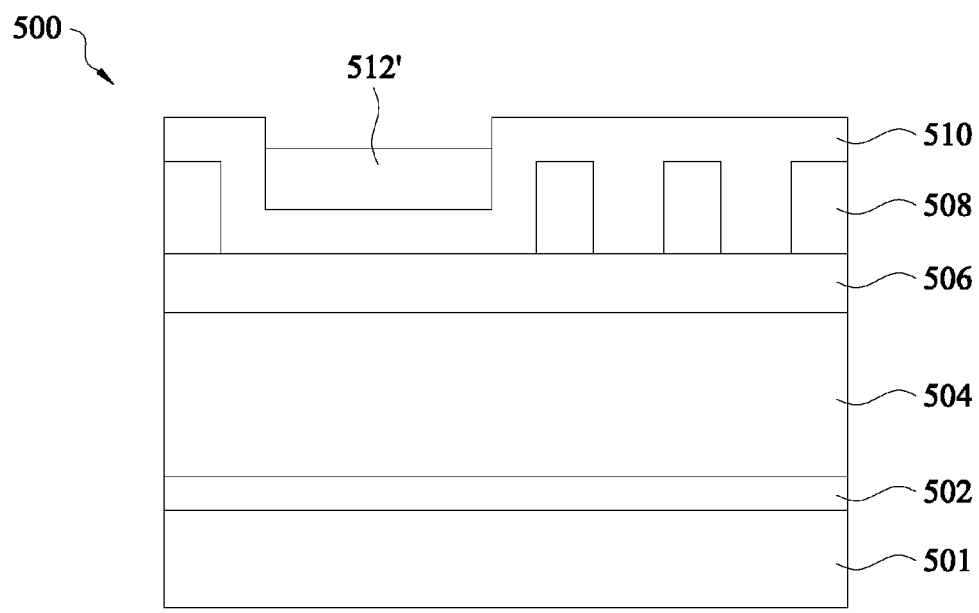
Figure 5E:
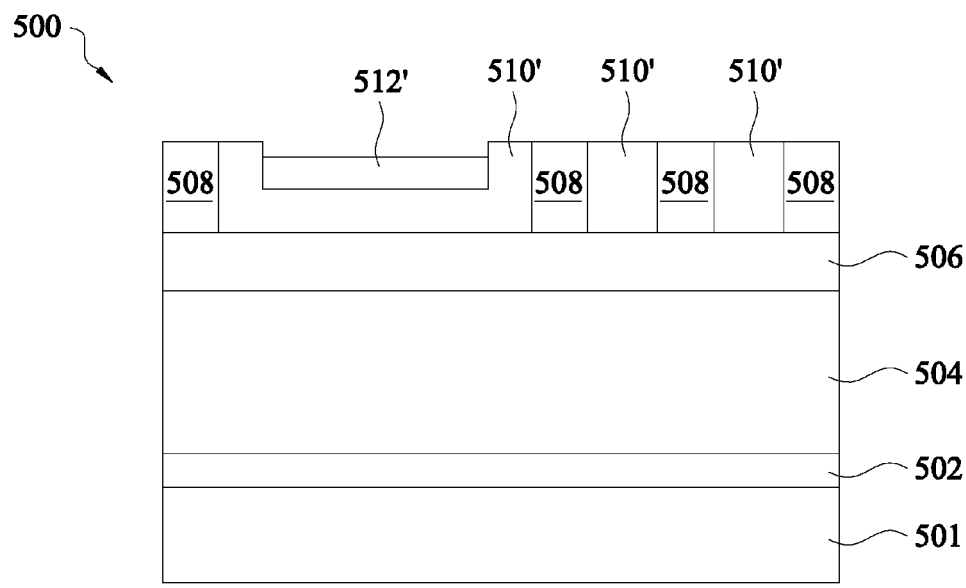

The method 400 continues to block 408 with selectively etching the liner layer 510. As illustrated in FIG. 5E, a portion (e.g., top portion) of the intact liner layer 510 is etched such that etched liner layer 510' exposes a top surface of the patterned mask layer 508. In an embodiment, the selective etching of the liner layer 510 may be implemented using a reactive ion etching (RIE) process and/or a plasma etching process tuned for recessing/etching the liner layer 510 while the patterned mask layer 508 remains substantially unchanged/intact in such an RIE process.

Figure 5F:
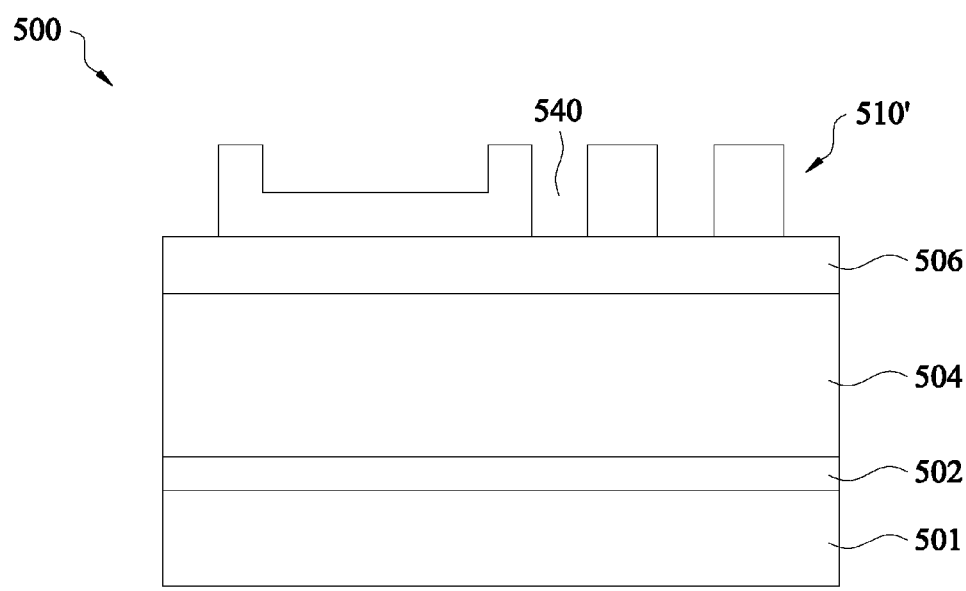

The method 400 continues to block 410 with removing the patterned mask layer 508 and removing the recessed first dielectric layer 512'. As shown in FIG. 5F, after the removal of the patterned mask layer 508 and the recessed first dielectric layer 512', a top surface (e.g., 540) of the anti-reflective layer 506 is exposed. This exposed surface 540 of the anti-reflective layer 506 includes a reciprocal pattern feature to the pattern feature provided by the patterned mask layer 508. That is, the portion of the top surface of the anti-reflective layer 506 that is covered by the patterned feature is now exposed. Thus, the liner layer 510'/510 may now serve as a hard mask, or simply mask, layer that is used to transfer a pattern to a coupled layer (e.g., the conductive layer 504). In some specific embodiments, the removing the patterned mask layer 508 may include dry etching, wet etching, and a variety of suitable etching process known in the art.

Figure 5G:
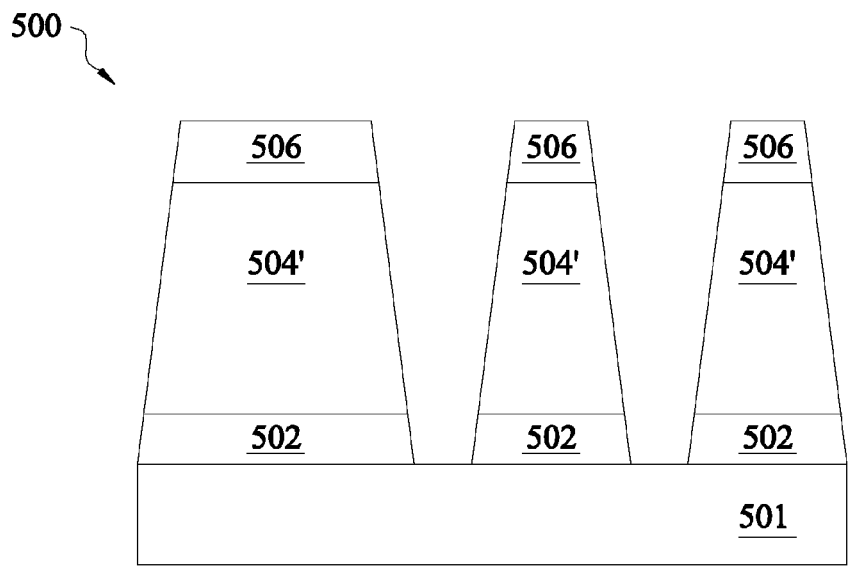

The method 400 then continues to block 412 with selectively etching the anti-reflective layer 506, the conductive layer 504, and/or the etch stop layer 502 through the exposed surface 540 as shown in FIG. 5G. In the illustrated embodiment of FIG. 5G, the etched conductive layer forms a conductive feature 504' that includes a tapered profile similar to the tapered profile as discussed with respect to FIG. 3E. That is, the conductive feature 504' includes two sloped side walls and a lower portion of the conductive feature 504' is wider than an upper portion of the conductive feature 504'. The etching the conductive layer 504 may include dry etching, plasma-based dry etching, and a variety of suitable metal etching process know in the art. In an example, the etching the conductive layer 504 may be implemented as etching the conductive layer 504 in a plasma etching chamber with flow of chemicals such as fluoride-based gaseous materials, chloride-based gaseous materials, and/or methane-based gaseous materials. After the conductive feature 504' is formed, the method 400 may include block 414 with removing the liner layer 510'/510. In some embodiments, the removing the liner layer may include dry etching, wet etching, and/or other etching processes.

Figure 5H:
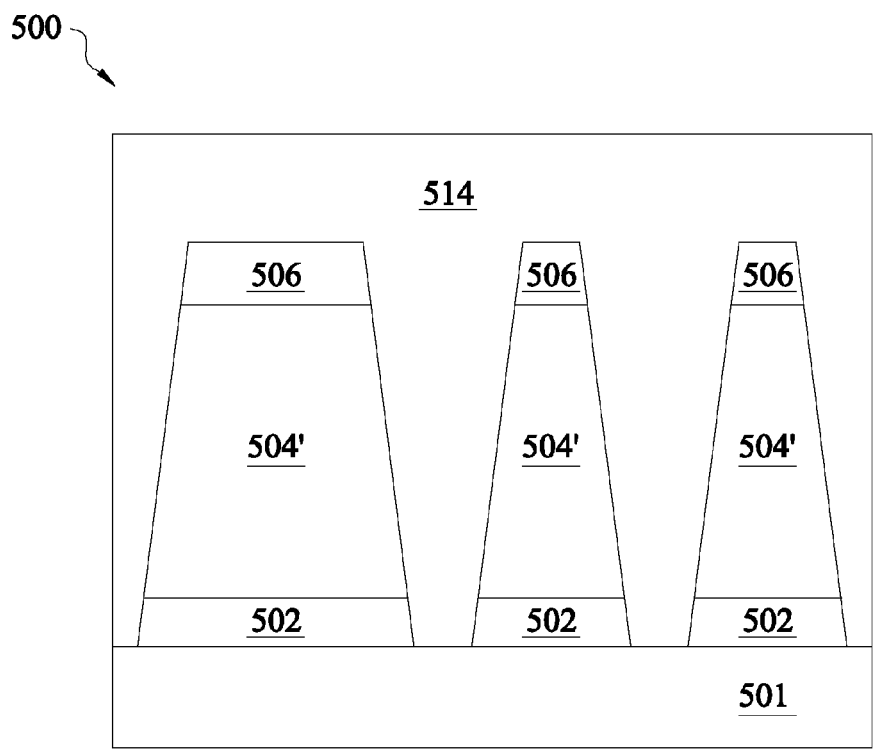
Figure 5I:
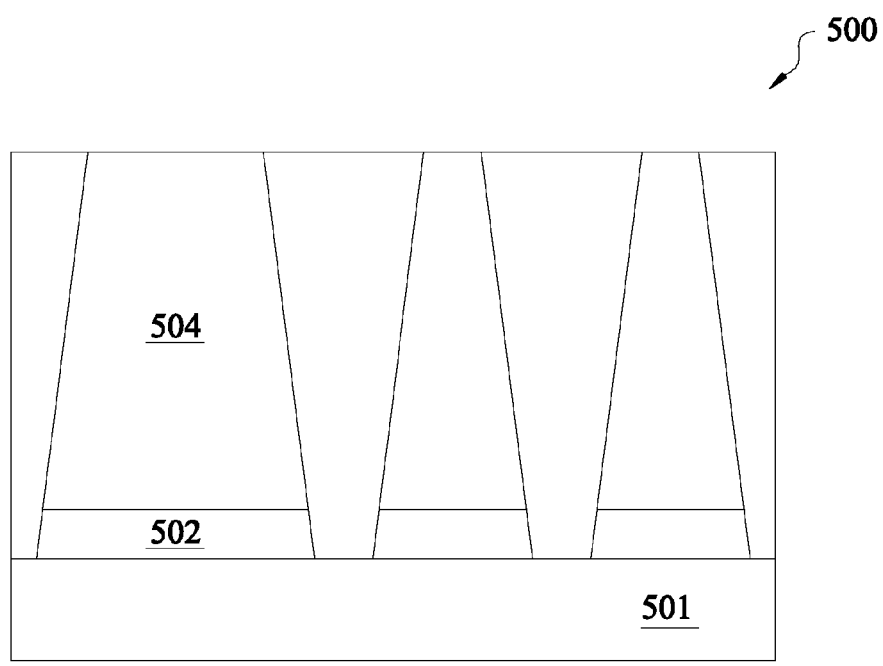

Referring to FIG. 4 in conjunction with FIG. 5H, the method 400 continues to block 416 with depositing a second dielectric layer 514 over the formed conductive feature 504'. In some specific embodiments, the second dielectric layer 514 may be a low-k (e.g., k<3.0) dielectric material and such low-k dielectric materials may be deposited by using a spin-on coating and/or a CVD process. Further, the second dielectric layer 514 may be configured to isolate/insulate each formed conductive feature. The method 400 then proceeds to block 418 with performing a chemical mechanical polishing (CMP) process. The CMP process is to planarize a top surface of the device 500 through removing excessive materials (e.g., 514) and conductive materials (e.g., 504/504') such that a polished surface of the conductive feature 504' and a polished surface of the second dielectric layer 514 are coplanar as shown in FIG. 5I.

Figure 6A:
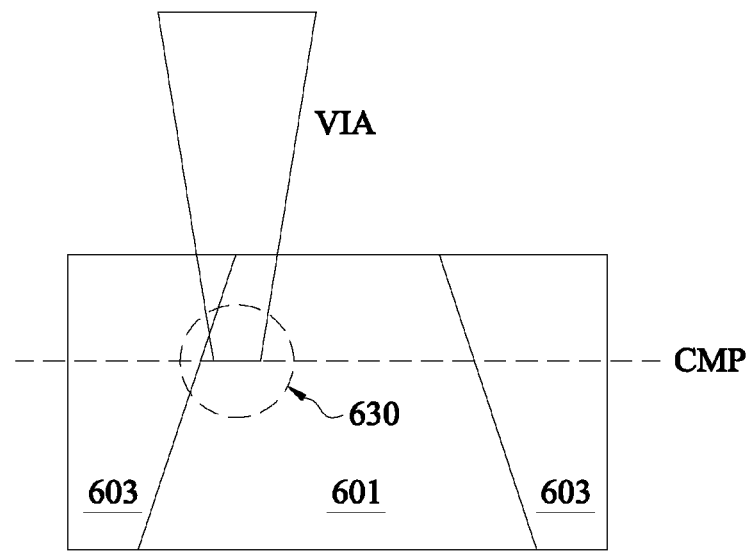
FIGS. 6A and 6B each provides an example of comparing two conductive features of a semiconductor device formed respectively by a conventional method and the disclosed method with respect to FIGS. 2 and 4 in accordance with embodiments of the present disclosure.
Figure 6B:
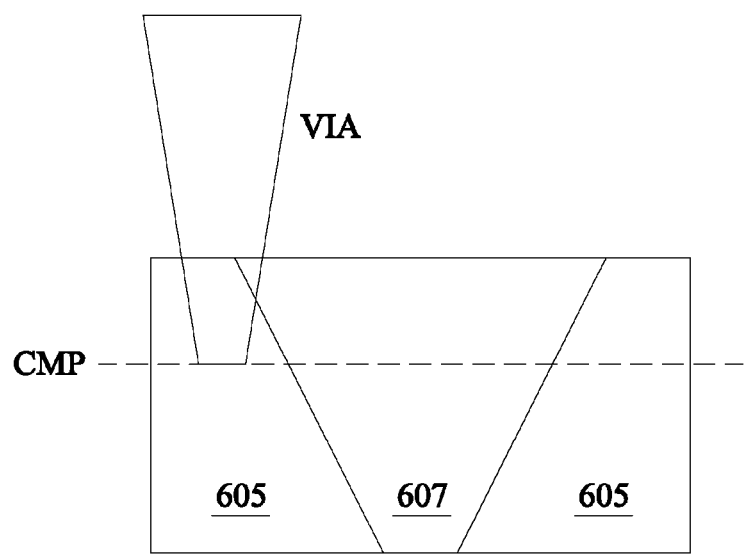

Referring now to FIGS. 6A and 6B, a comparison of two conductive features formed by a conventional approach (FIG. 6A) and by the disclosed approach (FIG. 6B) respectively is illustrated. In some embodiments, between each conductive feature 603 formed by the conventional approach, a low-k dielectric material (e.g., 601) may be deposited so as to isolate each conductive feature. Generally, to form the conductive feature 603, a patterned mask layer (e.g., a hard mask layer) is used to transfer a pattern directly to a coupled conductive layer through an etching process such that an etched trench or passage is formed for the later filling with a low-k material (e.g., 603). As illustrated in FIGS. 6A and 6B, by using the conventional approach, the conductive feature 603 includes a sloped side wall and the side wall is tapered off from top to bottom (i.e., an upper portion of the conductive feature is wider than a lower portion of the conductive feature). In other words, the conductive feature 603 includes a gradually decreased width from top to bottom. Such a decreased width may raise several issues. For example, multilayer interconnects are used to connect various devices (transistors, resistors, capacitors, etc.) to form an IC. In a typical multilayer interconnect structure, conductive lines (e.g., the conductive feature 603) are laid in stacked dielectric layers (e.g., low-k dielectric material 601) and are connected through vias from one layer to another layer. In general, a chemical-mechanical planarization (CMP) may be used before forming a via on the conductive line. If the conductive line includes a decreased width (from top to bottom) as shown in 603, a misalignment of the via may occur (e.g., 630). A misaligned via may cause accidental bridge (shorting) with a nearby conductive line, creating IC defects or cause excessive etching of the underlying dielectric layer, thereby creating IC reliability issues.

Thus, based on the above discussions, the present disclosure offers various advantages. It is understood, however, that not all advantages are necessarily discussed herein, and other embodiments may offer different advantages, and that no particular advantage is required for all embodiments.

One of the advantages is that the present disclosure offers a novel way of providing a conductive feature that is tapered off from bottom to top. Referring back to FIGS. 6A and 6B, in the stark contrast to the conductive feature formed by the conventional approach (FIG. 6A), the conductive feature 605 formed by the presently disclosed method (FIG. 6B) includes a gradually increased width from top to bottom. Such increased width (from top to bottom) of the conductive feature advantageously provide additional flexibility to form a via even though a misalignment of the via occurs. As mentioned above, a CMP process is generally used to polish/planarize the surface of the conductive feature and usually applied before forming a via. If a conductive feature includes an increased width from top to bottom (e.g., 605), even after being polished by a CMP process, such conductive feature may accordingly provide more real estate for a via to be formed. Another one of the advantages the present disclosure provides may include an intact low-k dielectric material that is configured to isolate each coupled conductive feature. Conventionally, the low-k dielectric material may be subjected to damage caused by an etching step (e.g., a plasma etching) because in the conventional approach, such low-k dielectric material is formed through an etching step before filling a conductive material to form a desired conductive feature. A damaged dielectric material may disadvantageously impact RC performance of the fabricated IC. However, in the present embodiment, the low-k dielectric material (e.g., 314, 514, 607) is formed (deposited) after a conductive feature is formed. Therefore, the low-k dielectric material formed by the presently disclosed method may not be subjected to the damage caused by an etching process.

The present disclosure provides an embodiment of a method for forming a conductive feature. The method includes forming a patterned mask layer over a conductive layer; forming a first dielectric layer over the patterned mask layer; removing a portion of the first dielectric layer to expose a portion of the patterned mask layer; removing the portion of the patterned mask layer; and removing portions of the conductive layer to form a conductive feature having a tapered profile.

The present disclosure provides another embodiment of a method for forming a conductive feature. The method includes forming a patterned mask layer over a conductive layer; forming a liner layer over the patterned mask layer; forming a first dielectric layer over the liner layer; removing portions of the first dielectric layer and the liner layer to exposing a portion of the patterned mask layer; removing the portion of the patterned mask layer; and removing portions of the conductive layer to form a conductive feature having a tapered profile.

The present disclosure provides yet another embodiment of a method for forming a conductive feature. The method includes forming a patterned mask layer over a conductive layer; forming a first dielectric layer over the patterned mask layer and the conductive layer; selectively etching the first dielectric layer, thereby exposing an upper surface of the patterned mask layer, wherein the upper surface of the first dielectric layer is lower than a top surface of the patterned mask layer; removing the patterned mask layer; and selectively etching the conductive layer to form a conductive feature having a tapered profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a patterned mask layer over a conductive layer;
   forming a first dielectric layer over the patterned mask layer;
   removing a portion of the first dielectric layer to expose a portion of the patterned mask layer;
   removing the portion of the patterned mask layer; and
   removing portions of the conductive layer to form a conductive feature having a tapered profile while using the first dielectric layer as a mask.

2. The method of claim 1, wherein the conductive feature has a top portion having a first width and a bottom portion having a second width that is greater than the first width.

3. The method of claim 1, further comprising depositing a second dielectric layer over the formed conductive feature.

4. The method of claim 3, further comprising performing a chemical mechanical polishing (CMP) process to the second dielectric layer and the formed conductive feature.

5. The method of claim 3, wherein the second dielectric layer includes a low k dielectric material layer.

6. The method of claim 1, wherein the first dielectric layer is formed of at least one of: spin-on glass materials, spin-on dielectric materials, resin materials, organometallic polymer materials, silicon nitride (SiN), silicon dioxide (SiO$_2$), amorphous silicon, carbon-based materials, titanium nitride (TiN), titanium oxide (TiO), and/or tantalum nitride (TaN).

7. The method of claim 1, wherein the substrate includes an etching stop layer (ESL) that is positioned below the conductive layer.

8. A method comprising:
   forming a patterned mask layer over a conductive layer;
   forming a liner layer over the patterned mask layer;
   forming a first dielectric layer over the liner layer;
   removing portions of the first dielectric layer and the liner layer to exposing a portion of the patterned mask layer;
   removing the portion of the patterned mask layer; and
   removing portions of the conductive layer to form a conductive feature having a tapered profile while using the liner layer as a mask.

9. The method of claim 8, wherein the conductive feature has a top portion having a first width and a bottom portion having a second width that is greater than the first width.

10. The method of claim 8, further comprising depositing a second dielectric layer over the formed conductive feature wherein the second dielectric layer is formed of a low k dielectric material.

11. The method of claim 10, further comprising performing a chemical mechanical polishing (CMP) process to the second dielectric layer and the formed conductive feature.

12. The method of claim 8, wherein the liner layer is formed of a material selected from the group consisting of directed self-assembly material, titanium nitride (TiN), titanium oxide (TiO), tantalum nitride (TaN), silicon nitride (SiN), silicon dioxide (SiO$_2$), and organometallic polymer material.

13. The method of claim 8, wherein the first dielectric layer is formed of at least one of: spin-on glass materials, spin-on dielectric materials, resin materials, organometallic polymer materials, silicon nitride (SiN), silicon dioxide (SiO$_2$), amorphous silicon, carbon-based materials, titanium nitride (TiN), titanium oxide (TiO), and/or tantalum nitride (TaN).

14. The method of claim 8, wherein the selectively etching the first dielectric layer includes removing part of the first dielectric layer such that a top surface of the etched first dielectric layer is lower than a top surface of the liner layer.

15. A method comprising:
   forming a patterned mask layer over a conductive layer;
   forming a first dielectric layer over the patterned mask layer and the conductive layer;
   selectively etching the first dielectric layer, thereby exposing an upper surface of the patterned mask layer, wherein the upper surface of the first dielectric layer is lower than a top surface of the patterned mask layer;
   removing the patterned mask layer; and
   selectively etching the conductive layer to form a conductive feature having a tapered profile while using the first dielectric layer as a mask.

16. The method of claim 15, wherein the conductive feature has a top portion having a first width and a bottom portion having a second width that is greater than the first width.

17. The method of claim 15, further comprising depositing a second dielectric layer over the etched conductive layer, thereby filling the opening in the conductive layer.

18. The method of claim 17, further comprising performing a chemical mechanical polishing (CMP) process to the second dielectric layer and the etched conductive layer.

19. The method of claim 15, wherein the first dielectric layer is formed of at least one of: spin-on glass materials, spin-on dielectric materials, resin materials, organometallic polymer materials, silicon nitride (SiN), silicon dioxide (SiO$_2$), amorphous silicon, carbon-based materials, titanium nitride (TiN), titanium oxide (TiO), and/or tantalum nitride (TaN).

20. The method of claim 15, wherein the substrate includes an etching stop layer (ESL) that is positioned below the conductive layer.

* * * * *